United States Patent [19]
Duncan

[11] Patent Number: 5,195,366
[45] Date of Patent: Mar. 23, 1993

[54] TESTING APPARATUS FOR TWO OR FOUR CYLINDER ENGINES

[76] Inventor: Coy R. Duncan, 701 S. Jarrett, Wynnewood, Okla. 73098

[21] Appl. No.: 748,572

[22] Filed: Aug. 22, 1991

[51] Int. Cl.[5] .......................................... G01M 15/00
[52] U.S. Cl. ................................................. 73/118.1
[58] Field of Search ............... 73/118.1; 324/527, 537, 324/545, 546, 547, 538, 555, 556, 503, 415; 340/644, 648, 646

[56] References Cited

U.S. PATENT DOCUMENTS

| | | |
|---|---|---|
| 1,205,448 | 11/1916 | Halbleib . |
| 1,659,041 | 2/1928 | Morgan . |
| 2,091,813 | 8/1937 | Hays ..................................... 324/538 |
| 2,381,549 | 8/1945 | Mabery . |
| 3,594,642 | 7/1971 | Wright . |
| 3,903,737 | 9/1975 | Burden et al. . |
| 3,921,063 | 11/1975 | Helling .................................. 324/415 |

Primary Examiner—Robert Raevis
Attorney, Agent, or Firm—Dunlap, Codding & Lee

[57] ABSTRACT

A test apparatus for testing an electric starter, a solenoid and a key operated switch of a two or four cylinder engine of an outdoor apparatus. The test apparatus includes a component box for removably supporting the key operated switch, the solenoid and the electric starter. When the key operated starter is closed by turning a key, a light indicator provides a visually perceivable output indication indicating the key operated switch functions to properly close. When the solenoid is connected to the power supply, the solenoid provides an audible output indication indicating the solenoid properly is engaged. When the electric starter is connected to the power supply, the electric starter engages and provides an audible and visual output indication indicating the starter properly is engaged or is properly operating.

14 Claims, 2 Drawing Sheets

TESTING APPARATUS FOR TWO OR FOUR CYLINDER ENGINES

FIELD OF THE INVENTION

The present invention relates to a test apparatus for testing an electric starter, a solenoid and a key operated switch of a two or four cylinder engine of an outdoor apparatus.

DESCRIPTION OF THE PREFERRED EMBODIMENTS

The present invention particularly relates to two or four cylinder engines used in connection with outdoor apparatus and which include an electric start system. The term "outdoor apparatus" as used herein means a device adapted and intended to be used outdoors such as a tiller, lawn mower, dune buggy or go-cart each of which is electric start for example.

During the operation of such outdoor apparatus, it commonly occurs that there is a failure in the electrical system associated with the key operated start system in that, when an individual turns the key to start the engine, the engine does not turn over or start. When this problem occurs, it is necessary to test the various components of the electric start system to determine which component has failed. The test apparatus of the present invention provides a quick, convenient and economical system for testing the main components of the electric start system of such a two or four cylinder engine.

Figure 1:
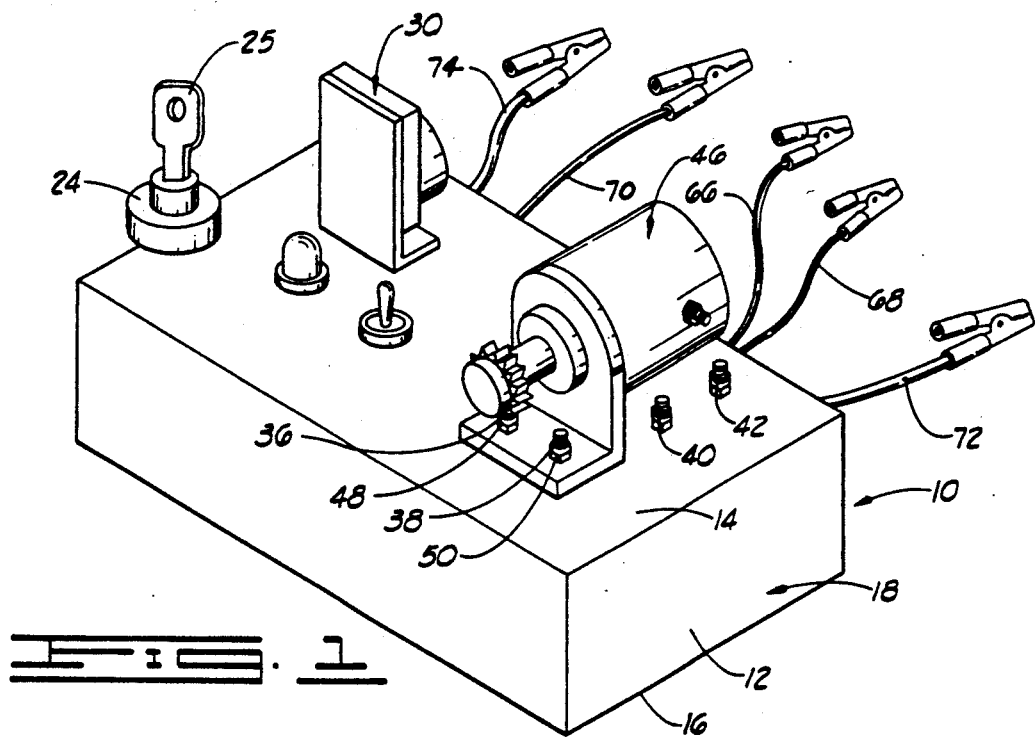
FIG. 1 is a front perspective, diagrammatic view of a test apparatus constructed in accordance with the present invention showing a typical electric starter, a typical solenoid and a typical key operated switch connected to the test apparatus with a key disposed in the key operated switch.
Figure 2:
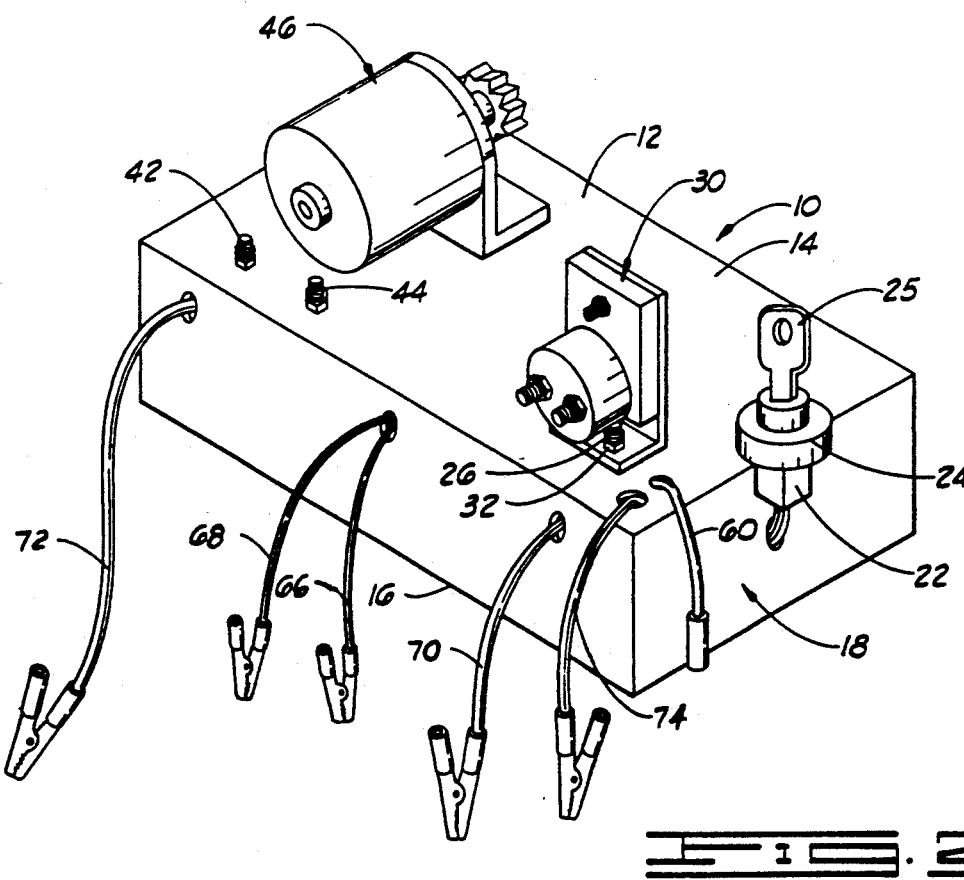
FIG. 2 is a back perspective view of the test apparatus of FIG. 1.

Shown in FIGS. 1 and 2 are perspective views of a test apparatus constructed in accordance with the present invention and designated therein by the reference numeral 10. The test apparatus 10 consists of a rectangularly shaped component box 12 having an upper surface 14, a lower surface 16 and a side wall 18 connected between the upper and the lower surfaces 14 and 16. The component box 12 encompasses a wiring space (not shown).

A key operated switch connector 22 is connected to the side wall 18 of the component box 12. The key operated switch connector 22 (FIG. 2) is adapted to removably receive a key operated switch 24. The key operated switch 24 is shown in FIGS. 1 and 2 operatively connected to the key operated switch connector 22. A key 25 is shown in FIGS. 1 and 2 operatively connected to the key operated switch 24. Key operated switches such as the key operated switch 24 which are used in connection with two or four cylinder engines in outdoor apparatus are commercially available and well known in the art and the key operated switch connector 22 is identical to the key operated switch connectors used in connection with such key operated switches and a detailed description of the construction and operation of such key operated switch connectors and associated key operated switches is not deemed necessary herein.

A pair of solenoid threaded posts are connected to the component box 12 with a portion of each solenoid posts extending a distance above the upper surface 14 of the component box 12 (only one post 26 is shown in FIG. 2). Each of the solenoid posts 26 are connected to ground. The solenoid posts are shaped and adapted such that openings in the mounting bracket of a solenoid 30 may be removably disposed over the solenoid threaded posts and secured to the solenoid posts via a pair of threaded nuts (only one threaded nut 32 being shown in FIG. 2), thereby connecting the solenoid 30 to ground. Solenoids such as the solenoid 30 used in two and fours cylinder engines with electric start systems are commercially available and well known in the art and a detailed description of the construction and operation of such solenoids is not deemed necessary herein.

The test apparatus 10 also includes five starter threaded posts 36, 38, 40, 42 and 44. Each of the starter threaded posts 36, 38, 40, 42 and 44 is connected to the component box 12 and each starter threaded posts 36, 38, 40, 42 and 44 extends a distance from the upper surface 14 of the component box 12. Each starter post 36, 38, 40, 42 and 44 is connected to ground. The starter threaded posts 36, 38, 40, 42 and 44 are adapted and sized to be removably disposed through holes in the mountings of an electric starter 46. As shown in FIG. 1, the electric starter 46 is removably connected to only two of the starter posts 36 and 38. Electric starters manufactured by different entities have different mounting configurations and the five starter threaded posts 36, 38, 40, 42 and 44 are adapted to be connected through the mounting holes in any one of these electric starters such as the electric starter 46 shown in FIG. 1. The electric starter 46 is secured to the starter posts 36 and 38 by way of nuts 48 and 50 (FIG. 1)

Figure 3:
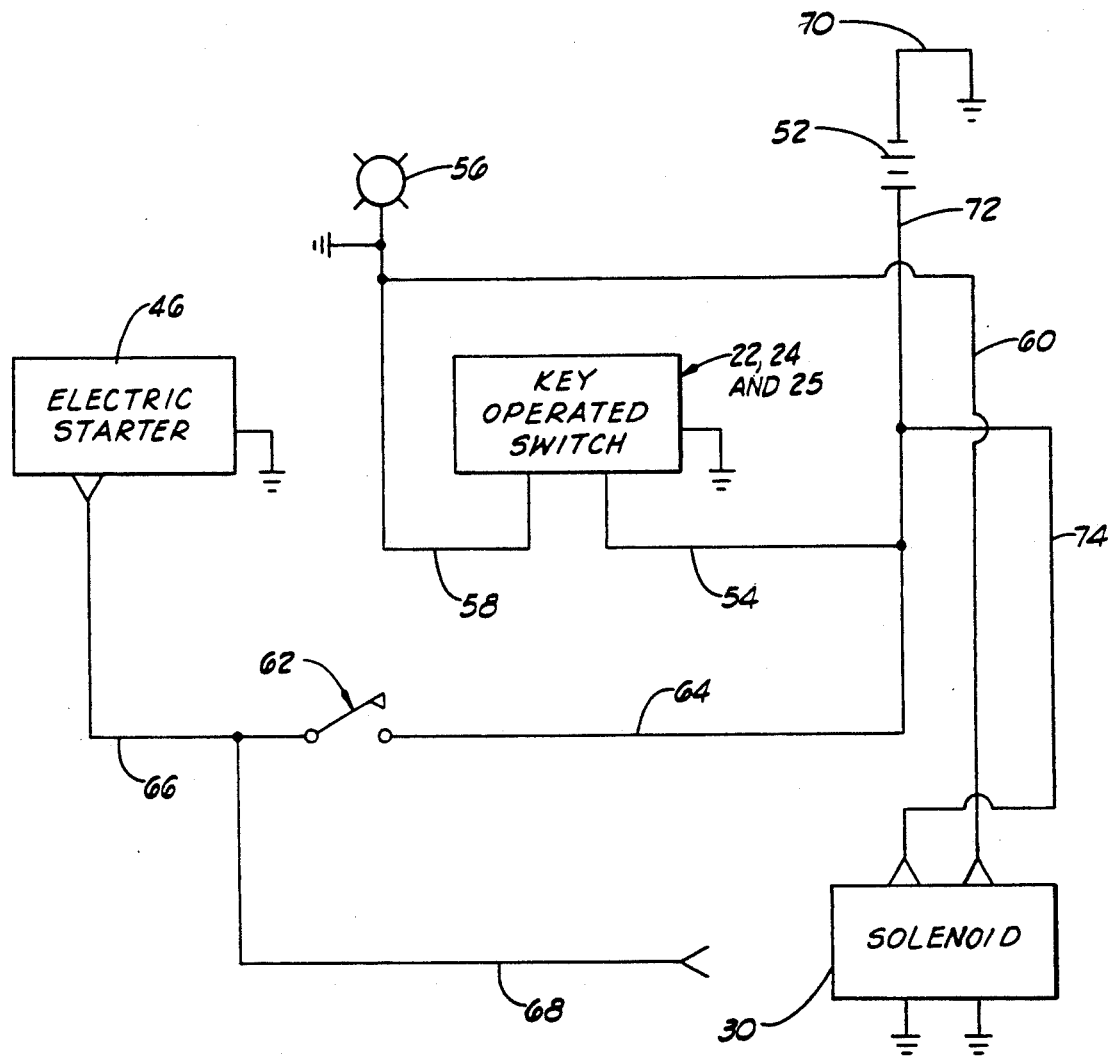
FIG. 3 is a schematic, diagrammatic view of the test apparatus of FIG. 1.

As shown in FIG. 3, the test apparatus 10 is adapted to be used in conjunction with a battery power supply 52. The test apparatus 10 may also be connected to an AC power supply through a voltage rectifier providing the DC power supply voltage to the test apparatus 10.

The battery power supply 52 is connected to the key operated switch 24 via the key operated switch connector 22 and a conductor 54. The key operated switch 24 also is connected to an indicator 56 by way of a conductor 58. The indicator 56 more particularly is a lamp type indicator adapted to provide a visually perceivable light indication when the indicator 56 is connected to the power supply 52.

The indicator 56 is removably connectable to the solenoid 30 by way of a conductor 60.

The battery power supply 52 is connected to a toggle switch 62 by way of a conductor 64. The toggle switch 62 is removable connectable to the electric starter 46 by way of a conductor 66.

The solenoid 30 also may be connected to the electric starter 46 by way of a conductor 68 during one aspect of the operation of the test apparatus 10 as will be described in greater detail below.

The battery power supply 52 more particularly is removably connected to the test apparatus 10 by way of conductors 70 and 72.

The battery power supply 52 also is connected to the solenoid 30 by way of a conductor 74.

In operation, if it is desired to test the key operated switch 24, the key operated switch 24 is operatively connected to the key operated switch connector 22.

The test apparatus 10 then is connected to the battery power supply 52 by way of the conductors 70 and 72. The key 25 then is inserted into the key operated switch 24 and turned to close the key operated switch 24. If the key 25 properly causes the key operated switch 24 to close, the indicator 56 is connected to the battery power supply by way of the key operated switch 24 and the indicator 56 outputs a visually perceivable light indicating that the key 25 has properly functioned to close the key operated switch 24 and that the key operated switch 24 is operable. If the key 25 is turned and the indicator 56 does not provide the visually perceivable outputted light indication, this indicates a malfunction in the key operated switch 24 which should result in repair or replacement of the key operated switch 24.

If it is desired to test the solenoid 30, the key operated switch 24 is operatively connected to the key operated switch connector 22 in the manner described before and the solenoid 30 is connected to the solenoid posts. The solenoid 30 then is connected to the indicator 56 by way of the conductor 60 and to the battery power supply 52 by way of the conductor 74. The key operated switch 24 thus is interposed between the solenoid 30 and the battery power supply 52 such that electric continuity is established between the solenoid 30 and the battery 25 power supply 52 in the closed position of the key operated switch 24 and the electric continuity is interrupted between the solenoid 30 and the key operated switch 24 in the opened position of the key operated switch 24.

After the operator has installed or connected the key operated switch 24 and the solenoid 30 to the component box 12, the operator inserts the key 25 in the key operated switch 24 and turns the key 25 to close the key operated switch 24. The closing of the key operated switch 24 connects the solenoid 30 to the battery power supply 52 by way of the key operated switch 24. If the solenoid 30 is operational or properly functioning, the solenoid 30 is engaged and provides an audible output indication indicating that the solenoid 30 properly has been engaged and is functioning properly.

If it is desired to test the electric starter 46, the operator connects the electric starter 46 to the component box 12 and connects the conductor 66 to the electric starter 46. The electric starter 46 thus is connected to the battery power supply 52 by way of the toggle switch 62. In this position, the operator closes the toggle switch 62. When the toggle switch 62 is closed, the electric starter 46 provides an audible output indication indicating that the electric starter 46 properly has been engaged and is functioning properly. The electric starter 46 also provides an audible output indication indicating that the starter 46 is not engaged properly and is not functioning properly. If this is the case and, in such a case, an audible output indication is provided indicating to the operator that the electric starter 46 needs to be repaired or replaced.

In one other sequence of operations, the key operated switch 24, the solenoid 30 and the electric starter 46 each is connected to the component box 12 in the manner described before and the solenoid 30 is connected to the battery power supply 52 by way of the conductor 74 and the solenoid 30 is connected to the conductor 68. In this operation of mode, the key operated switch 24 is connected to the battery power supply 52, the solenoid 30 is connected to the battery power supply 52 and the electric starter 46 is connected to the battery power supply 52 by way of the solenoid 30. In this mode of operation, the key operated switch 24 is closed and is tested in the manner described before and the solenoid 30 is engaged to provide an audible output indication indicating whether or not the solenoid 30 is properly functioning in the manner described before and the electric starter 46 is connected to the battery power supply 52 by way of the solenoid 30 so that it provides an audible output indication indicating whether or not the electric starter 46 is functioning properly.

Changes may be made in the construction and the operation of the various components, elements and assemblies of the test apparatus described herein without departing from the spirit and scope of the invention as defined in the following claims.

What is claimed is:

1. A test apparatus for testing an electric starter, a solenoid and a key operated switch operable with a key of a two or four cylinder engine of an outdoor apparatus and adapted for use with a power supply, comprising:
   a component box;
   means for removably connecting the key operated switch to the component box;
   means for removably connecting the solenoid to the component box;
   means for removably connecting the electric starter to the component box;
   an indicator connected to the key operated switch, the indicator providing a perceivable output indication when the key operated switch is connected to the component box and to the power supply and the key is operated to close the key operated switch when the key functions properly to close the key operated switch;
   means for connecting the solenoid to the power supply, the solenoid providing a perceivable output indication when the solenoid is connected to the power supply and properly is engaged; and
   means for connecting the electric starter to the power supply, the electric starter providing a perceivable output indication indicating whether or not the electric starter properly is engaged when the electric starter is connected to the power supply.

2. The test apparatus of claim 1 wherein the means for connecting the electric starter to the power supply comprises:
   a switch interposed between the electric starter and the power supply having an opened position and a closed position, the switch establishing electrical continuity between the electric starter and the power supply in the closed position and the switch interrupting electric continuity between the electric starter and the power supply in the opened position.

3. The test apparatus of claim 1 wherein the means for connecting the key operated switch to the power supply and the means for connecting the solenoid to the power supply are defined further as having the key operated switch interposed between the solenoid and the power supply, electrical continuity being established between the solenoid and the power supply in the closed position of the key operated switch and the electrical continuity being interrupted between the solenoid and the power supply in the opened position in the key operated switch.

4. The test apparatus of claim 1 wherein the means for removably connecting the solenoid to the component box is further defined as connecting the solenoid to the component box and connecting the solenoid to ground.

5. The test apparatus of claim 1 wherein the means for removably connecting the electric starter to the component box is further defined as removably connecting the electric starter to the component box and connecting the electric starter to ground.

6. The test apparatus of claim 1 wherein the component box further comprises an upper surface, and wherein the means for removably connecting the solenoid to the component box comprises:
   a plurality of posts connected to the component box and extending a distance above the upper surface of the component box, the posts being removably connectable to the solenoid and the posts being connected to ground.

7. The test apparatus of claim 6 wherein the means for removably connecting the electric starter to the component box further comprises:
   a plurality of posts connected to the component box and extending a distance above the upper surface of the component box, the posts being removably connectable to the electric starter and the posts being connected to ground.

8. The test apparatus of claim 1 wherein the indicator is a lamp producing visually perceptible output.

9. The test apparatus of claim 1 wherein the perceivable output indication provided by the electric starter is audible output produced by the electric starter itself.

10. The test apparatus for testing an electric starter, a solenoid and a key operated switch operable with a key of a two or four cylinder engine of an outdoor apparatus and adapted for use with a power supply, comprising:
    a component box;
    means for removably connecting the key operated switch to the component box;
    means for removably connecting the solenoid to the component box;
    means for removably connecting the electric starter to the component box;
    an indicator connected to the key operated switch, the indicator providing a perceivable output indication when the key operated switch is connected to the component box and to the power supply and the key is operated to close the key operated switch when the key functions properly to close the key operated switch; and
    means for connecting the solenoid to the key operated switch to energize the solenoid when the key is operated to close the key operated switch, the solenoid providing a perceivable output indication when the solenoid is energized.

11. The test apparatus of claim 10 wherein the indicator comprises a lamp producing visually perceptible output.

12. The test apparatus of claim 10 wherein the perceivable output indication provided by the solenoid is audible output produced by the solenoid itself.

13. The test apparatus of claim 10 further comprising: means for connecting the electric starter to the solenoid to energize the electric starter when the key is operated to close the key operated switch, the electric starter providing a perceivable output indication when the electric starter is energized.

14. The test apparatus of claim 13 wherein the perceivable output indication provided by the electric starter is audible output produced by the starter itself.

* * * * *